(12) United States Patent
Kim et al.

(10) Patent No.: US 11,245,420 B2
(45) Date of Patent: Feb. 8, 2022

(54) APPARATUS AND METHOD FOR RECOVERING A DATA ERROR IN A MEMORY SYSTEM

(71) Applicant: SK hynix Inc., Icheon (KR)

(72) Inventors: Dae Sung Kim, Icheon (KR); Seung Gu Ji, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/062,958

(22) Filed: Oct. 5, 2020

(65) Prior Publication Data

US 2021/0306003 A1 Sep. 30, 2021

(30) Foreign Application Priority Data

Mar. 31, 2020 (KR) .................. 10-2020-0038757

(51) Int. Cl.
 *H03M 13/11* (2006.01)
 *G06F 11/10* (2006.01)

(52) U.S. Cl.
 CPC ..... *H03M 13/1134* (2013.01); *G06F 11/1016* (2013.01); *G06F 11/1068* (2013.01); *H03M 13/1108* (2013.01); *H03M 13/1111* (2013.01)

(58) Field of Classification Search
 CPC .............................................. H03M 13/1134
 USPC ............... 714/758, 757, 760, 764, 766, 767
 See application file for complete search history.

(56) References Cited

U.S. PATENT DOCUMENTS

| | | | | |
|---|---|---|---|---|
| 5,822,251 A | * | 10/1998 | Bruce | G06F 12/0246 365/185.33 |
| 2010/0287454 A1 | * | 11/2010 | Dell | G06F 11/1044 714/807 |
| 2010/0299576 A1 | * | 11/2010 | Baysah | G06F 11/1044 714/763 |
| 2013/0318393 A1 | | 11/2013 | Tuma et al. | |
| 2014/0164868 A1 | * | 6/2014 | Haratsch | G06F 11/1012 714/763 |
| 2015/0046771 A1 | * | 2/2015 | Kim | H03M 13/17 714/764 |
| 2015/0149840 A1 | * | 5/2015 | Alhussien | G11C 16/08 714/719 |
| 2015/0286421 A1 | * | 10/2015 | Chen | G06F 3/0632 714/764 |
| 2016/0373137 A1 | | 12/2016 | Zhang et al. | |
| 2019/0250986 A1 | | 8/2019 | Kumar et al. | |

* cited by examiner

Primary Examiner — Fritz Alphonse

(57) ABSTRACT

A memory system includes a memory device and a controller. The memory device includes a plurality of non-volatile memory groups individually storing a plurality of data segments, each data segment corresponding to a codeword. The controller is configured to perform hard decision decoding to correct an error when the error is included in a first data segment among the plurality of data segments, determine whether other data segments associated with the first data segment, among the plurality of data segments, are readable when the hard decision decoding fails, and perform chipkill decoding based on the first data segment and the other data segments when the other data segments are readable.

20 Claims, 8 Drawing Sheets

APPARATUS AND METHOD FOR RECOVERING A DATA ERROR IN A MEMORY SYSTEM

CROSS-REFERENCE TO RELATED APPLICATIONS

This patent application claims the benefit of Korean Patent Application No. 10-2020-0038757, filed on Mar. 31, 2020, the entire disclosure of which is incorporated herein by reference.

TECHNICAL FIELD

An embodiment of this disclosure relates to a memory system, and more particularly, to an apparatus and a method for correcting a data error occurring in the memory system.

BACKGROUND

Recently, a paradigm for a computing environment has shifted to ubiquitous computing, which enables computer systems to be accessed virtually anytime and everywhere. As a result, the use of portable electronic devices, such as mobile phones, digital cameras, notebook computers, and the like, are rapidly increasing. Such portable electronic devices typically use or include a memory system that uses or embeds at least one memory device. The memory system may include a data storage device. The data storage device can be used as a main storage device or an auxiliary storage device of a portable electronic device.

Unlike a hard disk, a data storage device using a non-volatile semiconductor memory device is advantageous in that it has excellent stability and durability because it has no mechanical driving part (e.g., a mechanical arm), and has high data access speed and low power consumption. In the context of a memory system having such advantages, an exemplary data storage device includes a USB (Universal Serial Bus) memory device, a memory card having various interfaces, a solid state drive (SSD), or the like.

BRIEF DESCRIPTION OF THE DRAWINGS

The description herein makes reference to the accompanying drawings wherein like reference numerals refer to like parts throughout the figures.

Figure 1:
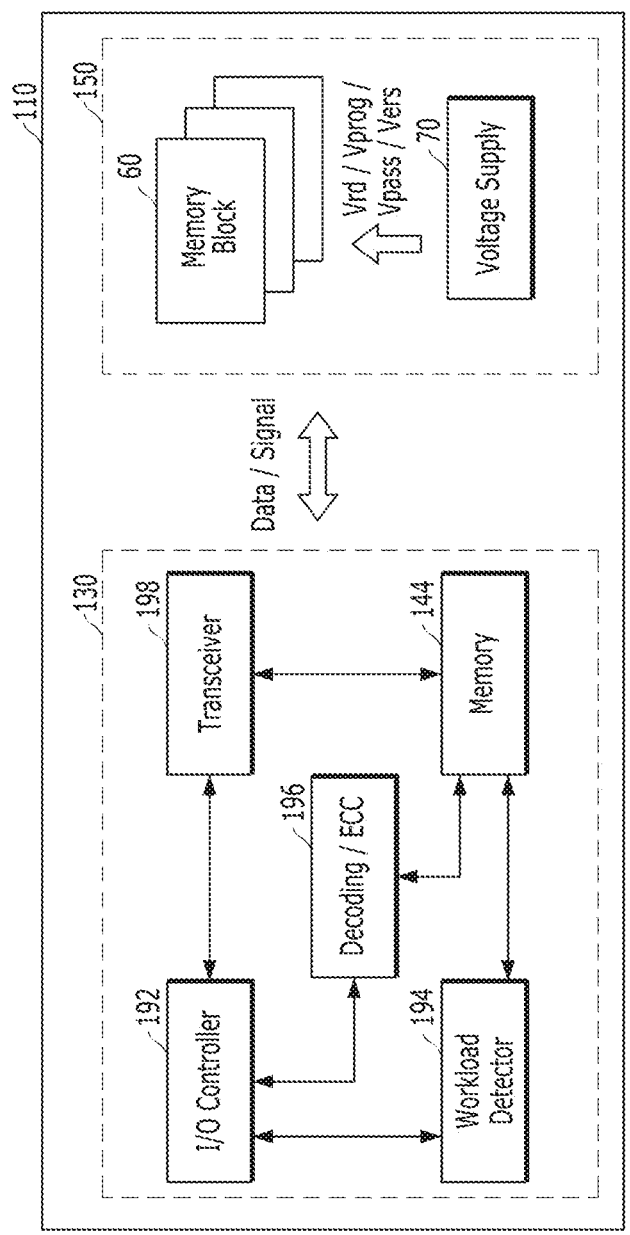
FIG. 1 illustrates a memory system according to an embodiment of the present disclosure.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

DETAILED DESCRIPTION

Various embodiments of the present disclosure are described below with reference to the accompanying drawings. Elements and features of the present disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the unit/circuit/component can be said to be configured to perform the task even when the specified blocks/unit/circuit/component is not currently operational (e.g., is not on). The blocks/units/circuits/components used with the "configured to" language include hardware—for example, circuits, memory storing program instructions executable to implement the operation, etc. Reciting that a block/unit/circuit/component is "configured to" perform one or more tasks is expressly intended not to invoke 35 U.S.C. § 112, sixth paragraph, for that block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware.

The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present disclosure can provide a data process system and a method for operating the data processing system, which includes components and resources such as a memory system and a host and is capable of dynamically allocating plural data paths used for data communication between the components based on usages of the components and the resources.

An embodiment of the present disclosure can provide an apparatus configured to, when an error is included in data output from a non-volatile memory device in a memory system, read other data stored in neighboring pages in parallel while performing an error recovery or restoration operation on the data including the error, so as to prepare or perform chipkill decoding to correct a multi-bit error. The memory system and an operation method thereof can reduce an increase in latency during a data input/output operation due to the error recovery or restoration operation.

Through this operation performed in the memory system, a plurality of means, algorithms, or methods for recovering an error may be performed in parallel, thereby reducing resource consumption and increasing error recovery efficiency rather than a case when all of the means, algorithms, or methods are sequentially performed in a predetermined order. Furthermore, an embodiment may provide a method or apparatus of the memory system which can improve the error recovery efficiency of the memory system, as well as data input/output performance, operational reliability, or operational stability of the memory system.

In an embodiment, a memory system can include a memory device including a plurality of non-volatile memory groups individually storing a plurality of data segments, each data segment corresponding to a codeword; and a controller configured to perform hard decision decoding to correct an error when the error is included in a first data segment among the plurality of data segments, determine whether other data segments associated with the first data segment, among the plurality of data segments, are readable when the hard decision decoding fails, and perform chipkill decoding based on the first data segment and the other data segments when the other data segments are readable.

The controller can be configured to perform the chipkill decoding and additional hard decision decoding or soft decision decoding on the first data segments in parallel, when the other data segments are readable.

The controller can be configured to skip performing soft decision decoding to the first data segments before performing the chipkill decoding, when the other data segments are readable.

The controller can be configured to perform hard decision decoding on the other data segments when the other data segments include an error. A maximum number of hard decision decoding performed on the other data segments can be less than a number of hard decision decoding performed on the first data segments.

The controller can be configured to perform the hard decision decoding a preset number of times. The hard decision decoding finally fails when the error can be not corrected after the hard decision decoding is performed the preset number of times.

The controller can be configured to determine whether the other data segments, are readable when a second hard decision decoding to the first data segment starts after a first hard decision decoding to the first data segment fails.

The controller can be configured to perform read operations for reading the other data segments in an interleaving manner. The read operations and the hard decision decoding to the first data segments can be performed in parallel.

The controller can be configured to stop the chipkill decoding when the hard decision decoding succeeds.

The controller can be configured to store a result of the hard decision decoding, and adjust a read voltage based on the result of the hard decision decoding while correcting an error included in the other data segments.

In another embodiment, a method for operating a memory system, including a memory device including a plurality of non-volatile memory groups individually storing a plurality of data segments, each data segment corresponding to a codeword and a controller configured to control the memory device, can include determining whether a first data segment among the plurality of data segments includes an error; performing hard decision decoding to correct the error when the error is included in the first data segment; determining whether other data segments associated with the first data segment, among the plurality of data segments, are readable when the hard decision decoding fails; and performing chipkill decoding based on the first data segment and the other data segments when the other data segments are readable.

The method can further include performing the chipkill decoding and additional hard decision decoding or soft decision decoding to the first data segment in parallel, when the other data segments are readable.

The method can further include skipping soft decision decoding to the first data segment before performing the chipkill decoding, when the other data segments are readable.

The method can further include performing hard decision decoding to the other data segments when the other data segments include an error. A maximum number of hard decision decoding performed to the other data segments can be less than a number of hard decision decoding performed to the first data segment.

The method can further include performing the hard decision decoding a preset number of times. The hard decision decoding finally fails when the error can be not corrected after the hard decision decoding is performed to the first data segment the preset number of times.

The determining whether the other data segments are readable can include determining whether the other data segments, are readable when a second hard decision decoding to the first data segment starts after a first hard decision decoding to the first data segment fails.

The method can further include performing read operations for reading the other data segments in an interleaving manner, wherein the read operations and the hard decision decoding to the first data segment are performed in parallel.

The method can further include stopping the chipkill decoding when the hard decision decoding succeeds.

The method can further include storing a result of the hard decision decoding; and adjusting a read voltage based on the result of the hard decision decoding while recovering an error included in the other data segments.

In another embodiment, a computer program product tangibly stored on a non-transitory computer readable medium, the computer program product comprises instructions to cause a multicore processor device that comprises a plurality of processor cores with multiple ones of the plurality of processor cores each including a processor and circuitry configured to couple the processor to a memory device including a plurality of non-volatile memory groups individually storing a plurality of data segments to: read a first data segment among the plurality of data segments; determine whether the first data segment includes an error; perform hard decision decoding to correct the error when the error is included in the first data segment; determine whether other data segments associated with the first data segment, among the plurality of data segments, are readable when the hard decision decoding fails; and perform chipkill decoding based on the first data segment and the other data segments when the other data segments are readable.

The chipkill decoding and additional hard decision decoding or soft decision decoding can be performed to the first data segment in parallel, when the other data segments are readable.

Embodiments of the present disclosure will now be described with reference to the accompanying drawings, wherein like numbers reference like elements.

FIG. 1 illustrates a memory system 110 according to an embodiment of the present disclosure.

Referring to FIG. 1, the memory system 110 may include a memory device 150 and a controller 130. The memory device 150 and the controller 130 may be physically separated from each other. The memory device 150 and the controller 130 may be connected via at least one data path. For example, the data path may include a channel and/or a way.

According to an embodiment, the memory device 150 and the controller 130 may be functionally divided. Further, according to an embodiment, the memory device 150 and the controller 130 may be implemented with a single chip or a plurality of chips.

The memory device 150 may include a plurality of memory blocks 60. Each of the plurality of memory blocks 60 may be a group of non-volatile memory cells. Data stored in each of the plurality of memory blocks 60 may be removed together by a single erase operation. Although not illustrated, each of the plurality of memory blocks 60 may include a plurality of pages, each of which is a group of non-volatile memory cells, and data may be stored in all memory cells in each page at the same time during a single program operation or data stored in all memory cells in each page may be output together during a single read operation.

Although not shown in FIG. 1, the memory device 150 may include a plurality of memory planes or a plurality of memory dies. According to an embodiment, a memory plane may be a logical or a physical partition including at least one memory block 60, a driving circuit capable of controlling an array including a plurality of non-volatile memory cells, and a buffer capable of temporarily storing data inputted to or outputted from the plurality of non-volatile memory cells.

In addition, according to an embodiment, a memory die may include at least one memory plane. The memory die may be a set of components implemented on a physically distinguishable substrate. Each memory die may be connected to the controller 130 through a data path. Each memory die may include an interface to exchange data and a signal with the controller 130.

According to an embodiment, the memory device 150 may include at least one memory block 60, at least one memory plane, or at least one memory die. An internal configuration of the memory device 150 may be different from the configuration shown in FIG. 1 according to performance of the memory system 110. That is, embodiments are not limited to the configuration shown in FIG. 1.

Referring to FIG. 1, the memory device 150 may include a voltage supply circuit 70 capable of supplying at least one voltage into the memory block 60. The voltage supply circuit 70 may supply a read voltage Vrd, a program voltage Vprog, a pass voltage Vpass, or an erase voltage Vers into a non-volatile memory cell included in the memory block 60. For example, in a read operation for reading data stored in a selected non-volatile memory cell included in the memory block 60, the voltage supply circuit 70 may supply the read voltage Vrd into the selected non-volatile memory cell. In the program operation for storing data in the selected non-volatile memory cell included in the memory block 60, the voltage supply circuit 70 may supply the program voltage Vprog into the selected non-volatile memory cell. Also, during the read operation or the program operation performed on the selected non-volatile memory cell, the voltage supply circuit 70 may supply a pass voltage Vpass into a non-selected non-volatile memory cell. In the erasing operation for erasing data stored in the memory block 60, the voltage supply circuit 70 may supply the erase voltage Vers into the memory block 60.

After programming data in a non-volatile memory cell included in the memory device 150, the controller 130 may read the data. In the data read by the controller 130, an error (at least 1-bit error) may be occasionally detected. In an initial usage stage of the memory device 150, e.g., when the memory device 150 is a very slightly worn memory device, it might be hard to find an error in the read data. However, as the number of write and erase cycles (P/E cycles) of the memory device 150 increases, e.g., as wear of non-volatile memory cells increases, the number of errors occurring in the read data may increase. In addition to wear of the memory device 150, an error may occur depending on a data retention time which is a period in which data is safely stored or keeps its value in a non-volatile memory cell in the memory device 150. Typically, the data retention time may be used as a characteristic parameter for operating the memory device 150. An error may occur when a value of the data stored in the non-volatile memory cell cannot be correctly recognized due to a characteristic in which a threshold voltage of the non-volatile memory cell changes over time.

When the controller 130 performs a read operation, data stored in a plurality of non-volatile memory cells included in the memory device 150 are transferred to the controller 130. For example, an input/output (I/O) controller 192 in the controller 130 may perform the read operation. The input/output controller 192 may transmit a read command to the memory device 150 through a transceiver 198. The transceiver 198 may deliver the read command to the memory device 150 and receive read data output from the memory device 150. The transceiver 198 may store the read data, which is transferred from the memory device 150, in a memory 144.

The input/output controller 192 allows decoding/ECC circuitry 196 to check and correct an error detected in the read data stored in the memory 144 in response to the read command. For example, the decoding/ECC circuitry 196 may cure or correct the error included in the read data stored in the memory 144 through an error correction code (ECC). Although the decoding/ECC circuitry 196 has performed an error correction operation using the error correction code (ECC), the error in the read data stored in the memory 144 may not be corrected. When the error included in the read data corresponding to the read command is not corrected, i.e., when the read data is not be recovered, the input/output controller 192 may determine that the read operation corresponding to the read command may fail.

As described above, the error included in the read data outputted from the memory device 150 may be caused by the change of the threshold voltage of the non-volatile memory cell. When the read voltage Vrd supplied for reading data stored in a plurality of non-volatile memory cells in the memory device 150 is changed in response to a changed distribution of threshold voltages of the plurality of non-volatile memory cells, an error in of the read data may be reduced. When the error included in the read data outputted from the memory device 150 is reduced, the decoding/ECC circuitry 196 can easily cure or correct the error included in the read data.

Regarding the memory system 110, it is desired to increase data storage capacity while maintaining data accuracy and an input/output speed. To this end, the memory system 110 may use an error correction code (ECC) technique and a signal processing technique to efficiently improve data reliability related to the data accuracy. A unit of data to which an error correction code (ECC) is applied to detect and correct an error occurring in data is called a codeword. A codeword has a length of n bits. The n bits includes user data of k bits and parity data of (n–k) bits. A code rate is calculated as (k/n). The higher the code rate, the more user data can be stored in each codeword. Generally, the longer the codeword and the smaller the code rate, the better the error correction capability of the error correction code (ECC).

The decoding/ECC circuitry 196 may decode data or information that is read from the memory device 150 and transmitted through a channel. The decoding/ECC circuitry 196 may include a decoder that performs hard decision decoding or soft decision decoding according to how many bits data or information is represented as. For example, the decoder may perform the hard decision decoding using memory cell output information that is represented as 1 bit. Herein, the 1-bit information may be called hard information. Meanwhile, the decoder may perform the soft decision decoding using more accurate memory cell output information that is represented as 2 or more bits. The 2- or more bit information may be called soft information. The soft decision decoding has a stronger error correction capability than the hard decision decoding. But the soft decision decoding may require high complexity in hardware implementation and/or high memory consumption, as compared with the hard decision decoding. In addition, generation of the soft information may require longer read latency than generation of the hard information.

An operation of reading data stored in the memory device 150 is performed through a word line. Data stored in a plurality of memory cells connected to a single word line may be read at the same time. In a read operation, a reference voltage is applied to a word line. The reference voltage may be compared with a threshold voltage for each memory cell to determine data representing information based on a comparison result. For example, the data stored in each memory cell is determined whether the threshold voltage has a lower or higher level than the reference voltage. Accordingly, one-time sensing (i.e., reading one time) per word line may be required to generate hard information. In a case of generating 2-bit soft information representing 4 levels, a level of the reference voltage is changed or adjusted, and three-time sensing (i.e., reading three times) using different levels of the reference voltage may be performed.

When an error is detected in data read from the memory device 150, the memory system 110 may perform an error correction operation step by step. For example, when an error is found in data read from a single page, the decoding/ECC circuitry 196 may perform hard decision decoding on the data. If the error in the corresponding data is not corrected through the hard decision decoding, the decoding/ECC circuitry 196 may alternately perform read bias optimization to adjust a level of the read voltage Vrd and the soft decision decoding. However, the read bias optimization and the soft decision decoding may require a relatively large number of sensing (reading) operations on memory cells to recover the data read from the single page, and thus read latency may be increased and quality of data (QoS) may be decreased. In an embodiment of the present disclosure, when the hard decision decoding fails at least one time, the memory system 110 may utilize chipkill decoding to recover and restore the data read from the single page more quickly and efficiently.

Through the chipkill decoding, the memory system 110 may recover or restore a multi-bit error detected in data read from the memory device 150. An error may be generated when data is incorrectly stored in a non-volatile memory cell of the memory device 150 or when data, which has been correctly stored in the non-volatile memory cell, may be incorrectly output for various reasons. In an embodiment, the chipkill decoding may be performed in any of two different ways or in a combination of the two ways. In an embodiment, how to perform the chipkill decoding may be selected or determined according to a hardware configuration of the memory system 110, but might not be changed through software designed for operations performed by the controller 130.

For applying the chipkill decoding to correct an error, data stored in the memory device 150 may constitute a codeword. The codeword may be a set of data bits and error check bits which an error correction code (ECC) algorithm provides for error detection and correction. The data bits may correspond to user data, and the error check bits may correspond to parity data. For example, it is assumed that 256 (=64×4) bits of data associated with each other are stored in four different locations within the memory device 150. When a user data area of the memory device 150 is designed in a unit of 64 bits, a size of the codeword may be 72 bits which includes a 64-bit user data and an 8-bit error correction data (or parity data). In this case, the memory system 110 may automatically correct an error when the error is a single-bit error and authentically detect a 2-bit error, which is called Single Error Correction/Double Error Detection (SEC/DED). When errors occur in multiple-bit data read from the four different locations storing 256 (=64×4) bits, the decoding/ECC circuitry 196 may perform the chipkill decoding to correct the errors included in the 256 (64×4) bits of data.

In an embodiment of the present disclosure, when the hard decision decoding performed on each codeword fails, the decoding/ECC circuitry 196 may perform the chipkill decoding after sensing/reading codewords from the four different locations in parallel. Accordingly, it is possible to avoid an increase in read latency and a decrease in quality of service (QoS) that may be generated by performing soft decision decoding after the hard decision decoding.

To improve performance of the chipkill decoding, the memory system 110 may include more error correction bits in each codeword to correct more than one bit error. The number of bits of user data and the number of bits of error correction data included in each codeword can be determined based on various mathematical algorithms that support correction on a multi-bit error. For example, by using a codeword of 144 bits consisting of 128 bits of user data and 16 bits of error correction data, a 4-bit error within a specific data bit field can be corrected. However, the 4-bit error may be adjacently distributed rather than being randomly distributed. Even if two different codewords, e.g., a codeword having 128 bits and a codeword having 64 bits, have the same ratio of error correction bits to user data bits, e.g., 16/128 and 8/64, error correction capability may be improved when a length of a codeword is longer. That is, the longer the codeword, the more bits of error that can be corrected or recovered.

In an embodiment, the chipkill decoding may recover or restore an error that cannot be corrected using an error correction code (ECC). The chipkill decoding can be performed on a 4-bit nibble (½ byte). The 4-bit nibble can be called a symbol. If a single nibble is wrong, i.e., when the single nibble includes an error, the chipkill decoding can correct all 4 bits in the single nibble as needed. However, if there are errors in two or more symbols, the chipkill decoding can detect which symbol include an error. The controller 130 reads 128-bit user data at a time together with 16-bit error check data from the memory device 150 supporting the chipkill decoding, and configures 144 bits of data. The 128-bit user data can be divided into 324-bit nibbles N0 to N31, and the 16-bit error check data can be divided into 44-bit nibbles C0 to C3. For example, the controller 130 may use the Galois field.

Based on the Galois multiplication table of 0 to 15 (hexadecimal) described below in Table 1, the four 4-bit check nibbles C0, C1, C2, and C3 generated by dividing the 16-bit error check data can be determined as shown in the following equations 1 to 4.

TABLE 1

| | | \multicolumn{16}{c}{Multiplicand} | | | | | | | | | | | | | | |
|---|---|---|---|---|---|---|---|---|---|---|---|---|---|---|---|---|
| | | 0 | 1 | 2 | 3 | 4 | 5 | 6 | 7 | 8 | 9 | a | b | c | d | e | f |
| N' plier | 0 | 0 | 0 | 0 | 0 | 0 | 0 | 0 | 0 | 0 | 0 | 0 | 0 | 0 | 0 | 0 | 0 |
| | 1 | 0 | 1 | 2 | 3 | 4 | 5 | 6 | 7 | 8 | 9 | a | b | c | d | e | f |
| | 2 | 0 | 2 | 4 | 6 | 8 | a | c | e | 3 | 1 | 7 | 5 | b | 9 | f | d |
| | 3 | 0 | 3 | 6 | 5 | c | f | a | 9 | b | 8 | d | e | 7 | 4 | 1 | 2 |
| | 4 | 0 | 4 | 8 | c | 3 | 7 | b | f | 6 | 2 | e | a | 5 | 1 | d | 9 |
| | 5 | 0 | 5 | a | f | 7 | 2 | d | 8 | e | b | 4 | 1 | 9 | c | 3 | 6 |
| | 6 | 0 | 6 | c | a | b | d | 7 | 1 | 5 | 3 | 9 | f | e | 8 | 2 | 4 |
| | 7 | 0 | 7 | e | 9 | f | 8 | 1 | 6 | d | a | 3 | 4 | 2 | 5 | c | b |
| | 8 | 0 | 8 | 3 | b | 6 | e | 5 | d | c | 4 | f | 7 | a | 2 | 9 | 1 |
| | 9 | 0 | 9 | 1 | 8 | 2 | b | 3 | a | 4 | d | 5 | c | 6 | f | 7 | e |
| | a | 0 | a | 7 | d | e | 4 | 9 | 3 | f | 5 | 8 | 2 | 1 | b | 6 | c |
| | b | 0 | b | 5 | e | a | 1 | f | 4 | 7 | c | 2 | 9 | d | 6 | 8 | 9 |
| | c | 0 | c | b | 7 | 5 | 9 | e | 2 | a | 6 | 1 | d | f | 3 | 4 | 8 |
| | d | 0 | d | 9 | 4 | 1 | c | 8 | 5 | 2 | f | b | 6 | 3 | e | a | 7 |
| | e | 0 | e | f | 1 | d | 3 | 2 | c | 9 | 7 | 6 | 8 | 4 | a | b | 5 |
| | f | 0 | f | d | 2 | 9 | 6 | 4 | b | 1 | e | c | 3 | 8 | 7 | 5 | a |

$$C0=N0+2*N1+3*N2+4*N3+5*N4+6*N5+7*N6+ \\ 8*N7+9*N8+a*N9+b*N10+c*N11+d*N12+ \\ e*N13+f*N14+N15+2*N16+3*N17+4*N18+ \\ 5*N19+6*N20+7*N21+8*N22+9*N23+a*N24+ \\ b*N25+c*N26+d*N27+e*N28+f*N29+N31$$ [Equation 1]

$$C1=N0+N1+N2+N3+N4+N5+N6+N7+N8+N9+N10+ \\ N11+N12+N13+N14+N30+N31$$ [Equation 2]

$$C2=N15+N16+N17+N18+N19+N20+N21+N22+N23+ \\ N24+N25+N26+N27+N28+N29+N30+N31$$ [Equation 3]

$$C3=N0+9*N1+e*N2+d*N3+b*N4+7*N5+6*N6+ \\ f*N7+2*N8+c*N9+5*N10+a*N11+4*N12+ \\ 3*N13+8*N14+N15+9*N16+e*N17+d*N18+ \\ b*N19+7*N20+6*N21+f*N22+2*N23+c*N24+ \\ 5*N25+a*N26+4*N27+3*N28+8*N29+N30$$ [Equation 4]

In the above-described equations 1 to 4, '*' means the Galois multiplication, and '+' means an exclusive OR (XOR) operation. When reading data, the controller 130 may calculate the four 4-bit check nibbles C0 to C3 generated by dividing the 16-bit error check data, as described above. In addition, the controller 130 may read the data again and repeat the same calculation to generate different four 4-bit check nibbles, i.e., another set C0' to C3'. Thereafter, the controller 130 may generate a nibble set, which is called syndromes of S0, S1, S2, and S3, through Equations 5 to 8 as follows.

$$S0=C0+C0'$$ [Equation 5]

$$S1=C1+C1'$$ [Equation 6]

$$S2=C2+C2'$$ [Equation 7]

$$S3=C3+C3'$$ [Equation 8]

If there are no errors in the data read from the memory device 150, the check nibble set C0 to C3 is the same as the check nibble set C0' to C03', so that all the syndromes S0 to S3 become '0'. However, if there is an error and thus the check nibble set C0 to C3 is different from the check nibble set C0' to C03', at least one of the syndromes S0 to S3 does not become '0'.

For example, it is assumed that there is an error in one of the 324-bit nibbles N0 to N31, e.g., in the 8th nibble N7. Because the 8th nibble N7 is included in the equations for calculating the check nibbles C0, C1, and C3, the syndromes S0, S1, and S3 may not be '0'. However, the syndrome S2 becomes '0'. First, because the syndrome S1 is not '0' and the syndrome S2 is '0,' it can be recognized by the controller 130 that the error occurred in one of the first 15 nibbles N0 to N14. When dividing the syndrome S0 by the syndrome S1 and referring to the above formula, the divided result becomes 8, so it can be recognized that the error has occurred in the 8th nibble N7.

Therefore, a current value of the 8th nibble N7 read from the memory device 150 is incorrect, and the syndrome S1 can be understood as an XOR (exclusive OR) result of an original correct value and the incorrect value of the 8th nibble N7. Therefore, the original correct value can be restored by an XOR operation of the syndrome S1 and the incorrect value.

According to an embodiment, the controller 130 may determine whether an error is included in data output from a plurality of non-volatile memory cells in the memory device 150 and correct the error when the error is found. A procedure in which the decoding/ECC circuitry 196 in the controller 130 detects an error and corrects the error may be monitored by a workload detector 194. For example, the workload detector 194 may detect that the decoding/ECC circuitry 194 performs the read bias optimization and the soft decision decoding after the hard decision decoding fails. When the decoding/ECC circuitry 194 cannot correct an error included in specific data by performing the hard decision decoding on the specific data, the workload detector 194 may determine whether at least one another page associated with the specific data, e.g., other data transmitted through different channels from other pages located in different dies or planes, is readable. When the other data can be read from other locations associated with the specific data, the workload detector 194 can collect the other data from the other locations to support the chipkill decoding independently while the decoding/ECC circuitry 196 performs the soft decision decoding on the specific data. After the workload detection unit 194 collects the other data, the decoding/ECC circuitry 196 may perform the chip kill decoding based on the specific data and the other data. Through this procedure according to an embodiment of the present disclosure, when the hard decision decoding fails, the controller 130 may perform the chipkill decoding so as to avoid or reduce deterioration of data input and output performance which can be caused by performing the read bias optimization and the soft decision decoding. Such an operation can reduce resources required for the memory system 110 to correct an error.

According to an embodiment, to improve or enhance the error correction efficiency, the memory system 110 may set or establish detailed operations with respect to the chipkill decoding. For example, in order to perform the chipkill decoding in an error correction operation performed by the decoding/ECC circuitry 196 in the memory system 110, the controller 130 may read other data (additional data) that is located at a different location from where the specific data is stored and associated with the specific data including an error on which the hard decision decoding fails. At this time, the decoding/ECC circuitry 196 may perform hard decision decoding on the additional data if an error is found even in the additional data. Because the additional data has been read to perform the chipkill decoding, and thus the additional data is not outputted to an external device, the workload detector 194 may limit the maximum number of performing the hard decision decoding on the additional data to 2-3 times that is smaller than the maximum number of performing the hard decision decoding on the target data. Performing the hard decision decoding several times on the additional data including an error before the chipkill decoding is performed may decrease efficiency of the error correction operation.

According to an embodiment, the decoding/ECC circuitry 196 may store a result obtained by performing the chipkill decoding on first data in the memory 144 to perform the chipkill decoding on second data, the chipkill decoding on the second data being performed after the chipkill decoding performed on the first data. When a lot of errors occur in the first data, there is a high possibility that many errors occur in the second data stored at locations adjacent to where the first data is located.

Further, after storing an intermediate result obtained during the chipkill decoding in the memory 144, the intermediate result stored in the memory 144 may be utilized for the hard or soft decision decoding performed in parallel with the chipkill decoding. In addition, if a result obtained during the chipkill decoding, e.g., a decoding result obtained until the hard decision decoding is performed x times, is stored in the memory 144, the controller 130 may apply or utilize the stored result to adjust or optimize the read voltage Vrd for reading other data and correcting an error in the other data.

Hereinafter, referring to FIGS. 2 and 3, some operations performed by the memory system 110 of FIG. 1 will be described in detail.

Figure 2:
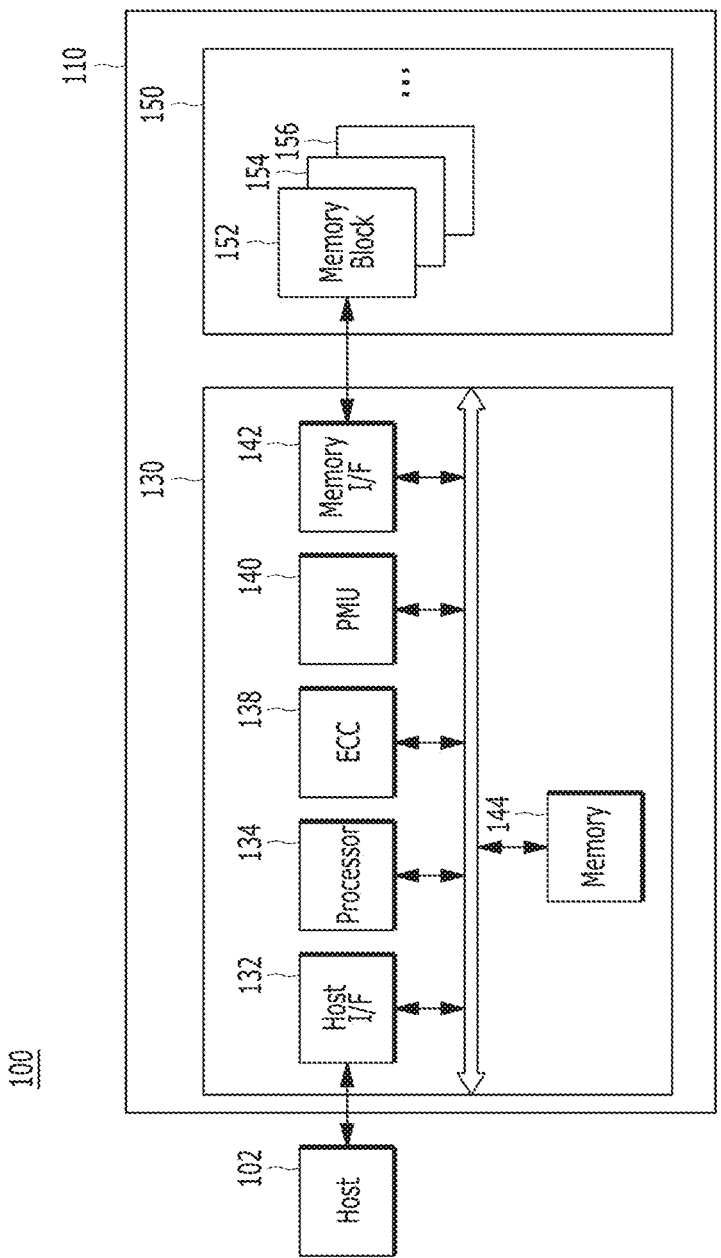
FIG. 2 illustrates a data processing system according to an embodiment of the present disclosure.

FIG. 2 illustrates a data processing system 100 in accordance with an embodiment of the present disclosure. Referring to FIG. 2, the data processing system 100 may include a host 102 engaged or interlocked with a memory system 110.

The host 102 may include, for example, a portable electronic device, such as a mobile phone, an MP3 player, a laptop computer, or the like, or a non-portable electronic device, such as a desktop computer, a game player, a television (TV), a projector, or the like.

The host 102 includes at least one operating system (OS), which can generally manage and control functions and operations performed in the host 102. The OS can provide interoperability between the host 102 engaged with the memory system 110 and a user needing and using the memory system 110. The OS may support functions and operations corresponding to user's requests. By the way of example but not limitation, the OS may include a general operating system or a mobile operating system according to mobility of the host 102. The general operating system may include a personal operating system or an enterprise operating system according to system requirements or a user's environment. The enterprise operating system can be specialized for securing and supporting high performance computing. The mobile operating system may be subject to support services or functions for mobility such as a power saving function.

The host 102 may include a plurality of operating systems. The host 102 may execute multiple operating systems interlocked with the memory system 110. The host 102 may transmit a plurality of commands corresponding to user's requests to the memory system 110, thereby performing operations corresponding to the plurality of commands within the memory system 110.

A controller 130 in the memory system 110 may control a memory device 150 in response to a request or a command inputted from the host 102. For example, the controller 130 may perform a read operation to provide data read from the memory device 150 to the host 102, and perform a write operation (or a program operation) to store data inputted from the host 102 in the memory device 150. In order to perform data input/output (I/O) operations, the controller 130 may control and manage internal operations for data reading, data programming, data erasing, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components included in the controller 130 may vary according to an implementation form, an operation performance, or the like regarding the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD card, a micro-SD card, a universal serial bus (USB) storage device, a universal flash storage (UFS) device, a compact flash (CF) card, a smart media (SM) card, a memory stick, and the like. Components may be added to or omitted from the controller 130 based on implementation of the memory system 110.

The host 102 and the memory system 110 may include a controller or an interface for transmitting and receiving a signal, data, and the like, under a predetermined protocol. For example, the host interface 132 in the memory system 110 may include an apparatus capable of transmitting a signal, data, and the like to the host 102 or receiving a signal, data, and the like from the host 102.

The host interface 132 included in the controller 130 may receive a signal, a command (or a request), or data from the host 102. That is, the host 102 and the memory system 110 may use a predetermined protocol to transmit and receive data therebetween. Protocols or interfaces, supported by the host 102 and the memory system 110 for sending and receiving data therebetween, may include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIPI), and the like. According to an embodiment, the host interface 132 is a kind of layer for exchanging data with the host 102 and is implemented with, or driven by, firmware called a host interface layer (HIL).

The Integrated Drive Electronics (IDE) or Advanced Technology Attachment (ATA), used as one of the interfaces for transmitting and receiving data between the host 102 and the memory system 110, can use a cable including 40 wires connected in parallel to support data transmission and reception between the host 102 and the memory system 110. When a plurality of memory systems 110 are connected to a single host 102, the plurality of memory systems 110 may be divided into a master and slaves by using a dip switch to which the plurality of memory systems 110 are connected or based on positions of the plurality of memory systems 110. A memory system 110 set as the master may be used as a main memory device. The IDE (ATA) has evolved into Fast-ATA, ATAPI, and Enhanced IDE (EIDE).

The Serial Advanced Technology Attachment (SATA) is a kind of serial data communication interface that is compatible with various ATA standards of parallel data communication interface which is used by Integrated Drive Electronics (IDE) devices. The 40 wires in the IDE interface can be reduced to six wires in the SATA interface. For example, 40 parallel signals for the IDE can be converted into 6 serial signals for the SATA to implement data transmission and reception between the IDE and the SATA. The SATA has been widely used because of its faster data transmission and reception rate and its less resource consumption in the host 102 used for data transmission and reception. The SATA may support connections of up to 30 external devices to a single transceiver included in the host 102. In addition, the SATA can support hot plugging that allows an external device to be attached to or detached from the host 102 even while data communication between the host 102 and another device is executed. Thus, the SATA makes the memory system 110 be connected to or disconnected from the host 102 like a device supported by a universal serial bus (USB) even when the host 102 is powered on. For example, in the host 102 having an eSATA port, the memory system 110 may be freely attached to or detached from the host 102, like an external hard disk.

The Small Computer System Interface (SCSI) is a kind of serial data communication interface used for connection between a computer, a server, and/or another peripheral device. The SCSI can provide a high transmission speed, as compared with other interfaces such as the IDE and the SATA. In the SCSI, the host 102 and at least one peripheral device (e.g., the memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 external devices to a single transceiver included in the host 102.

The Serial Attached SCSI (SAS) can be understood as a serial data communication version of the SCSI. In the SAS, not only the host 102 and a plurality of peripheral devices are connected in series, but also data transmission and reception between the host 102 and each peripheral device may be performed in a serial data communication scheme. The SAS can support connection between the host 102 and the peripheral device through a serial cable instead of a parallel cable, so as to easily manage equipment using the SAS and enhance or improve operational reliability and communication performance. The SAS may support connections of eight external devices to a single transceiver included in the host 102.

The Non-volatile memory express (NVMe) is a kind of interface based at least on a Peripheral Component Interconnect Express (PCIe) designed to increase performance and design flexibility of the host 102, servers, computing devices, and the like equipped with the non-volatile memory system 110. Here, the PCIe can use a slot or a specific cable for connecting the host 102, such as a computing device, and the memory system 110, such as a peripheral device. For example, the PCIe can use a plurality of pins (e.g., 18 pins, 32 pins, 49 pins, 82 pins, etc.) and at least one wire (e.g., ×1, ×4, ×8, ×16, etc.), to achieve high speed data communications over several hundred Mega bits per second (e.g. 250 MB/s, 500 MB/s, 985 MB/s, 1969 MB/s, etc.). According to an embodiment, the PCIe scheme may achieve bandwidths of tens to hundreds of Giga bits per second. The NVMe can support an operation speed of the non-volatile memory system 110, such as an SSD, which operates at a higher speed than a hard disk.

According to an embodiment, the host 102 and the memory system 110 may be connected to each other through a universal serial bus (USB). The USB is a kind of scalable, hot-pluggable plug-and-play serial interface that can provide cost-effective standard connectivity between the host 102 and a peripheral device such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. Here, the ECC encoder can perform error correction encoding on data that is to be programmed in the memory device 150 to thereby generate encoded data into which parity bits are added, and the encoded data is stored in memory device 150. The ECC decoder can detect and correct error bits contained in the data read from the memory device 150 when the controller 130 reads the data stored in the memory device 150. In other words, after performing error correction decoding on the data read from the memory device 150, the error correction circuitry 138 can determine whether the error correction decoding has succeeded or failed, and output an instruction signal (e.g., an error correction success signal or an error correction fail signal). The error correction circuitry 138 can use the parity bits, which are generated during the ECC encoding process, to correct the error bits of the read data. When the number of the error bits is greater than or equal to a threshold number of correctable error bits, the error correction circuitry 138 cannot correct the error bits and instead may output an error correction fail signal indicating failure in correcting the error bits. In an embodiment, the error correction circuitry 138 may correspond to the decoding/ECC circuitry 196 shown in FIG. 1.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The error correction circuitry 138 may include circuits, modules, systems, and/or devices for performing the error correction operation based on at least one of the above described codes.

For example, the ECC decoder may perform the hard decision decoding or the soft decision decoding on data transmitted from the memory device 150. Here, the hard decision decoding can be understood as one of two methods broadly classified for error correction. The hard decision decoding may include an operation of correcting an error by reading digital data of '0' or '1' from a non-volatile memory cell in the memory device 150. Because the hard decision decoding is performed using a binary logic signal, a design or a configuration of circuit or algorithm for performing the hard decision decoding may be simple and a processing speed of the hard decision decoding may be faster than the soft decision decoding.

Meanwhile, the soft decision decoding, which is distinguished from the hard decision decoding, may include an error correction operation based on threshold voltages of a non-volatile memory cell in the memory device 150 that correspond to two or more quantized values, e.g., multi-bit data, approximate values, an analog value, or the like. The controller 130 may receive two or more alphabets or quantized values from a plurality of non-volatile memory cells in the memory device 150, and then perform a decoding operation on the received values based on information generated by characterizing the quantized values as a combination of information such as conditional probability or likelihood.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 can not only detect power-on or power-off, but also generate a trigger signal to enable the memory system 110 to back up a current status when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, to allow the controller 130 to control the memory device 150 in response to a command or a request inputted from the host 102. The memory interface 142 may generate a control signal for the memory device 150 and may process data inputted to or outputted from the memory device 150 under the control of the processor 134 when the memory device 150 is a flash memory. For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented by executing firmware called a Flash Interface Layer (FIL) as a component for exchanging data with the memory device 150.

According to an embodiment, the memory interface 142 may support an open NAND flash interface (ONFi), a toggle mode or the like for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may act as a working memory of the memory system 110 or the controller 130 by storing temporary or transactional data occurred or delivered for operations in the memory system 110 and the controller 130. For example, the memory 144 may temporarily store read data outputted from the memory device 150 in response to a request from the host 102 before the read data is outputted to the host 102. In addition, the memory 144 may temporarily store write data inputted from the host 102 before programming the write data in the memory device 150. When the controller 130 controls operations such as a data read operation, a data write or program operation, a data erase operation, and so on of the memory device 150, data transmitted or generated between the controller 130 and the memory device 150 of the memory system 110 may be stored in the memory 144. In addition to the read data or the write data, the memory 144 may store information, e.g., map data, read requests, program requests, etc., necessary for performing operations for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on.

In an embodiment, the memory 144 may be implemented with a volatile memory. For example, the memory 144 may be implemented with a static random access memory (SRAM), a dynamic random access memory (DRAM), or both. Although FIG. 2 illustrates the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request provided by the host 102. According to an embodiment, the processor 134 may execute firmware to control the program operation or the read operation in the memory system 110. Herein, the firmware may be referred to as a flash translation layer (FTL). An example of the FTL will be described in detail referring to FIG. 3. According to an embodiment, the processor 134 may be implemented with a microprocessor or a central processing unit (CPU).

According to an embodiment, the memory system 110 may be implemented with at least one multi-core processor. The multi-core processor is a kind of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command inputted from the host 102. Further, the memory system 110 may be independent of a command or a request inputted from an external device such as the host 102. Typically, an operation performed by the controller 130 in response to the request or the command inputted from the host 102 may be considered a foreground operation. An operation performed by the controller 130 independently regardless of the request or the command inputted from the host 102 may be considered a background operation. The controller 130 can perform the foreground or background operation for reading, writing, or erasing data in the memory device 150. In addition, a parameter set operation corresponding to a set parameter command or a set feature command as a set command transmitted from the host 102 may be considered a foreground operation. Meanwhile, as a background operation performed without a command transmitted from the host 102, the controller 130 can perform garbage collection (GC), wear leveling (WL), bad block management for identifying and processing bad blocks, or the like in relation to a plurality of memory blocks 152, 154, and 156 included in the memory device 150.

According an embodiment, substantially similar operations may be performed as both the foreground operation and the background operation. For example, if the memory system 110 performs garbage collection in response to a request or a command inputted from the host 102 (e.g., Manual GC), the garbage collection can be considered a foreground operation. However, when the memory system 110 performs garbage collection independently of the host 102 (e.g., Auto GC), the garbage collection can be considered a background operation.

When the memory device 150 includes a plurality of dies (or a plurality of chips) including non-volatile memory cells, the controller 130 may be configured to perform a parallel processing on the memory device 150 in response to plural requests or commands inputted from the host 102 in order to improve performance of the memory system 110. For example, the transmitted requests or commands may be divided and provided simultaneously into the plurality of dies or the plurality of chips in the memory device 150. The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, plural operations corresponding to the requests or the commands can be performed simultaneously or in parallel. Such a processing method or scheme can be considered as an interleaving method. Because a data input/output speed of the memory system 110 operating with the interleaving method may be faster than that without the interleaving method, data I/O performance of the memory system 110 can be improved.

By the way of example but not limitation, the controller 130 can recognize statuses regarding a plurality of channels (or ways) associated with the plurality of memory dies included in the memory device 150. The controller 130 may determine the status of each channel or each way as one of a busy state, a ready state, an active state, an idle state, a normal state, and an abnormal state. The controller's determination of which channel or way an instruction (and/or data) is delivered through may be associated with a physical block address. For example, which die(s) the instruction (and/or the data) is delivered into may be associated with a physical block address. The controller 130 may refer to descriptors delivered from the memory device 150. The descriptors may be data with a predetermined format or structure and include a block or page of parameters describing characteristics of the memory device 150. For instance, the descriptors may include device descriptors, configuration descriptors, unit descriptors, and the like. The controller 130 may refer to or use the descriptors to determine which channel(s) or way(s) is used to exchange an instruction or data.

Referring to FIG. 2, the memory device 150 in the memory system 110 may include the plurality of memory blocks 152, 154, and 156. Each of the plurality of memory blocks 152, 154, and 156 includes a plurality of non-volatile memory cells. According to an embodiment, the memory block 152, 154, or 156 may be a group of non-volatile memory cells erased together. The memory block 152, 154, or 156 may include a plurality of pages, each of which is a group of non-volatile memory cells read or programmed together. Although not shown in FIG. 2, each memory block 152, 154, or 156 may have a three-dimensional stack structure for a high integration. Further, the memory device 150 may include a plurality of dies, each die including a plurality of planes, each plane including the plurality of memory blocks 152, 154, and 156. The memory device 150 may be differently configured to improve performance of the memory system 110.

In the memory device 150 shown in FIG. 2, the plurality of memory blocks 152, 154, and 156 are included. The plurality of memory blocks 152, 154, and 156 may be any of different types of memory blocks, such as a single-level cell (SLC) memory block, a multi-level cell (MLC) memory block, or the like, according to the number of bits that can be stored in or represented by one memory cell.

Here, the SLC memory block includes a plurality of pages implemented by memory cells, each memory cell storing one-bit data. The SLC memory block can have high data I/O operation performance and high durability. The MLC memory block includes a plurality of pages implemented by memory cells, each memory cell storing multi-bit data (e.g., two- or more bits of data). The MLC memory block can have larger storage capacity for the same space compared to the SLC memory block. The MLC memory block can be highly integrated in a view of storage capacity.

In an embodiment, the memory device 150 may be implemented with MLC memory blocks such as a double-level cell (DLC) memory block, a triple-level cell (TLC) memory block, a quadruple-level cell (QLC) memory block, and a combination thereof. The double-level cell (DLC) memory block may include a plurality of pages implemented by memory cells, each memory cell capable of storing 2-bit data. The triple-level cell (TLC) memory block can include a plurality of pages implemented by memory cells, each memory cell capable of storing 3-bit data. The quadruple-level cell (QLC) memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a multi-level cell (MLC) memory block included in the memory device 150 as an SLC memory block that stores one-bit data in one memory cell. A data input/output speed of the multi-level cell (MLC) memory block can be slower than that of the SLC memory block. Therefore, when the MLC memory block is used as the SLC memory block, a margin for a read or program operation can be reduced. The controller 130 can utilize a portion of the multi-level cell (MLC) memory block as the SLC memory block to achieve a faster data input/output speed. For example, the controller 130 may use such a MLC memory block as a buffer to temporarily store data because the buffer may require a high data input/output speed for improving performance of the memory system 110.

Further, according to an embodiment, the controller 130 may program data in a multi-level cell (MLC) block a plurality of times without performing an erase operation on the MLC memory block included in the memory device 150. In general, non-volatile memory cells have a feature that does not support data overwrite. However, the controller 130 may use a feature in which a multi-level cell (MLC) may store multi-bit data in order to program plural 1-bit data in the MLC by performing a write operation for programming 1-bit data in the MLC a plurality of times. For an MLC overwrite operation, the controller 130 may store the number of program times as separate operation information when 1-bit data is programmed in a non-volatile memory cell. According to an embodiment, an operation for uniformly levelling threshold voltages of non-volatile memory cells may be carried out before another data is overwritten in the same non-volatile memory cells.

In an embodiment of the disclosure, the memory device 150 is embodied as a non-volatile memory such as a flash memory, for example, a NAND flash memory, a NOR flash memory, or the like. Alternatively, the memory device 150 may be implemented by at least one of a phase change random access memory (PCRAM), a ferroelectrics random access memory (FRAM), a spin injection magnetic memory (STT-RAM), a spin transfer torque magnetic random access memory (STT-MRAM), and so on.

Figure 3:
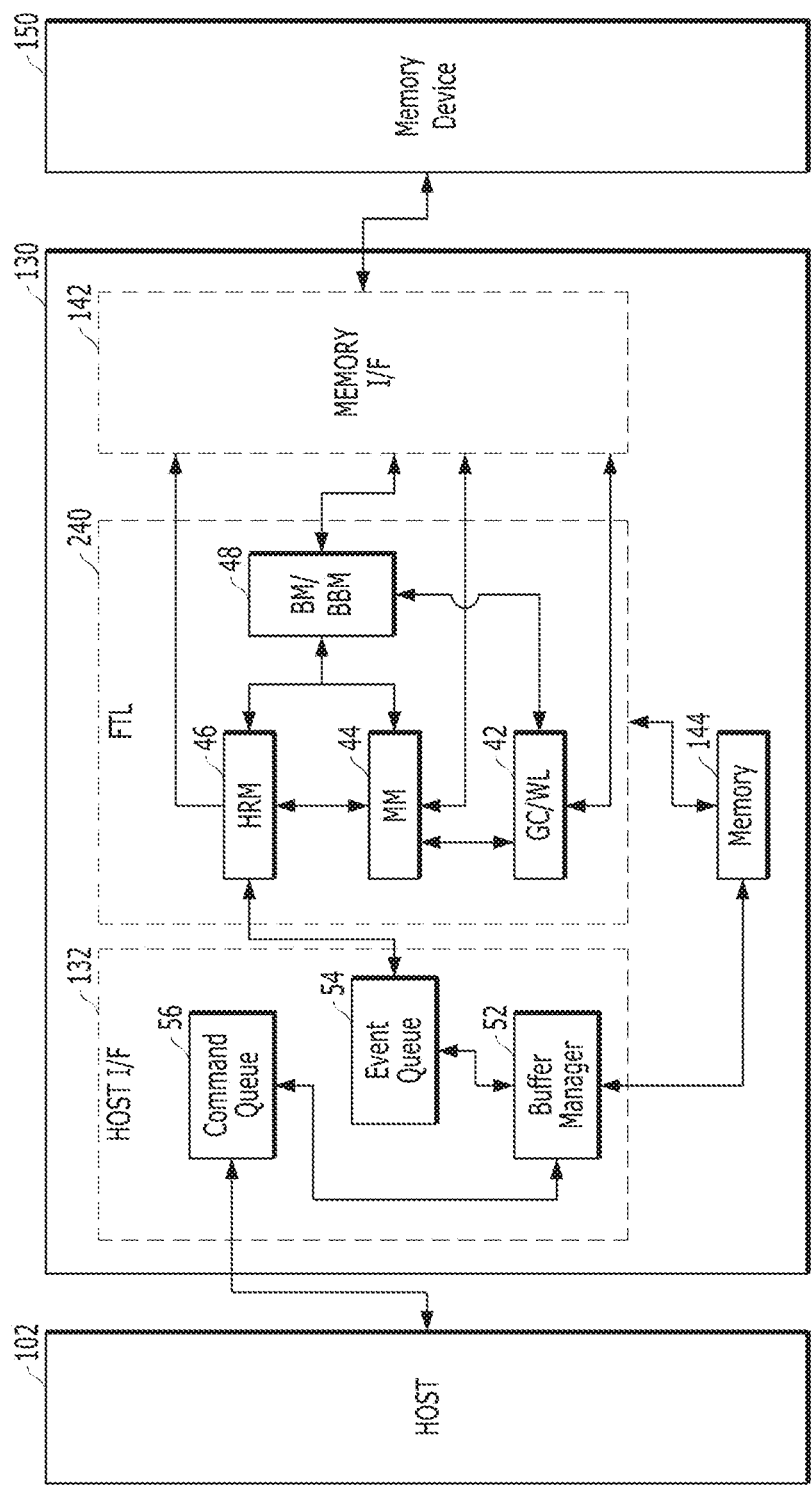
FIG. 3 illustrates a memory system according to an embodiment of the present disclosure.

Referring to FIG. 3, a controller 130 in a memory system in accordance with another embodiment of the disclosure is described. The controller 130 cooperates with a host 102 and a memory device 150. As illustrated in FIG. 3, the controller 130 includes a host interface 132, a flash translation layer (FTL) 240, a memory interface 142, and a memory 144.

Although not shown in FIG. 3, in accordance with an embodiment, the ECC unit 138 illustrated in FIG. 2 may be included in the flash translation layer (FTL) 240. In another embodiment, the ECC unit 138 may be implemented as a separate module, circuit, firmware, or the like from the flash translation layer (FTL) 240, which is included in or associated with the controller 130.

The host interface 132 is for handling commands, data, and the like transmitted from the host 102. By way of example but not limitation, the host interface 132 may include a command queue 56, a buffer manager 52, and an event queue 54. The command queue 56 may sequentially store commands, data, and the like received from the host 102 and output them to the buffer manager 52 in an order in which they are stored. The buffer manager 52 may classify, manage, or adjust the commands, the data, and the like, which are received from the command queue 56. The event queue 54 may sequentially transmit events for processing the commands, the data, and the like received from the buffer manager 52.

A plurality of commands or data having the same characteristic, e.g., read or write commands, may be transmitted from the host 102 to the memory system 110, or commands and data having different characteristics may be transmitted to the memory system 110 after being mixed or jumbled by the host 102. For example, a plurality of commands for reading data (read commands) may be delivered to the memory system 110, or a command for reading data (read command) and a command for programming/writing data (write command) may be alternately transmitted to the memory system 110. The host interface 132 may sequentially store commands, data, and the like, which are transmitted from the host 102, to the command queue 56. Thereafter, the host interface 132 may estimate or predict what kind of internal operation the controller 130 will perform according to the characteristics of commands, data, and the like. The host interface 132 may determine a processing order and a priority of commands, data, and the like based at least on their characteristics. According to characteristics of commands, data, and the like transmitted from the host 102, the buffer manager 52 in the host interface 132 determines whether the buffer manager 52 should store commands, data, and the like in the memory 144, or whether the buffer manager 52 should deliver the commands, the data, and the like into the flash translation layer (FTL) 240. The event queue 54 receives events, entered from the buffer manager 52, which are to be internally executed and processed by the memory system 110 or the controller 130 in response to the commands, the data, and the like, and delivers the events to the flash translation layer (FTL) 240 in the order received from the buffer manager 52.

In accordance with an embodiment, the flash translation layer (FTL) 240 illustrated in FIG. 3 may work in a multi-thread scheme to perform the data input/output (I/O) operations. A multi-thread FTL may be implemented through a multi-core processor using multi-thread included in the controller 130.

In accordance with an embodiment, the flash translation layer (FTL) 240 may include a host request manager (HRM) 46, a map manager (MM) 44, a state manager 42, and a block manager 48. The host request manager (HRM) 46 may manage the events entered from the event queue 54. The map manager (MM) 44 may handle or control map data. The state manager 42 can perform garbage collection (GC) or wear leveling (WL). The block manager 48 may execute commands or instructions onto a block in the memory device 150.

By way of example but not limitation, the host request manager (HRM) 46 may use the map manager (MM) 44 and the block manager 48 to handle or process requests according to read and program commands, and events which are delivered from the host interface 132. The host request manager (HRM) 46 may send an inquiry request to the map data manager (MM) 44 to determine a physical address corresponding to the logical address which is entered with the events. The host request manager (HRM) 46 may send a read request with the physical address to the memory interface 142 to process the read request (to handle the events). On the other hand, the host request manager (HRM) 46 may send a program request (or write request) to the block manager 48 to program data to a specific empty page storing no data in the memory device 150, and then transmit a map update request corresponding to the program request to the map manager (MM) 44 to update an item relevant to the programmed data in information of mapping logical and physical addresses to each other.

Here, the block manager 48 may convert a program request delivered from the host request manager (HRM) 46, the map data manager (MM) 44, and/or the state manager 42 into a flash program request used for the memory device 150 to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the multi-channel and multi-directional flash controller.

On the other hand, the block manager 48 may manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move valid data to an empty block and erase data stored in blocks containing the moved valid data so that the block manager 48 may have enough free blocks that are empty blocks with no data. If the block manager 48 provides information regarding a block to be erased to the state manager 42, the state manager 42 may check all flash pages of the block to be erased to determine whether each page of the block is valid. For example, to determine validity of each page, the state manager 42 may identify a logical address recorded in an out-of-band (OOB) area of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is complete.

The map manager 44 may manage a logical-physical mapping table. The map manager 44 may process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold value, a program request may be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 programs the latest version of data for the same logical address of the page and currently issues an update request. When the status manager 42 requests the map update in a state in which copying of valid page(s) is not completed normally, the map manager 44 may not update the mapping table. It is because the map request is issued with old physical information if the status manger 42 requests a map update and a valid page copy is completed later. The map manager 44 may perform a map update operation to ensure accuracy only when the latest map table still points to the old physical address.

Figure 4:
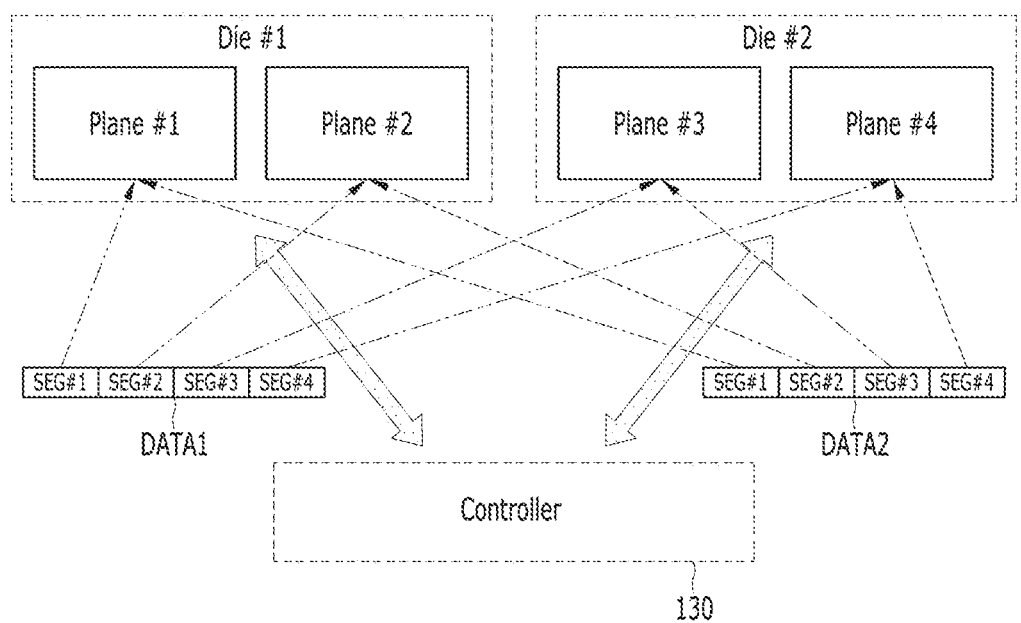
FIG. 4 illustrates chipkill decoding performed in a memory system.

FIG. 4 illustrates chipkill decoding performed in a memory system. The chipkill decoding illustrated in FIG. 4 will be described with reference to the controller 130 and the memory device 150 shown in FIGS. 1 to 3.

Referring to FIG. 4, the controller 130 in the memory system 110 may store data based on a configuration of the memory device 150 including a plurality of non-volatile memory cells. The memory device 150 may include a plurality of dies, e.g., Die #1 and Die #2, and each of the plurality of dies Die #1 and Die #2 may include a plurality of planes, e.g., two planes. In FIG. 4, the die Die #1 includes two planes Plane #1 and Plane #2, and the die Die #2 includes two planes Plane #3 and Plane #4. Each of the plurality of planes may include a plurality of memory blocks 60 shown in FIG. 1.

According to an embodiment, the controller 130 and the memory device 150 may be connected through a data path including a plurality of channels and a plurality of ways. The controller 130 and the plurality of dies Die #1 and Die #2 may be connected to a single channel. Each of the plurality of ways connected to a single channel may be connected to a corresponding one of the plurality of dies Die #1 and Die #2. The controller 130 may be connected to each of the plurality of dies Die #1 and Die #2 included in the memory device 150 through a data path including at least one channel and at least one way.

In addition, each of the plurality of dies Die #1 and Die #2 may include a plurality of planes. Each plane may include a page-sized buffer or register. Through this configuration, when data input/output operations are performed in parallel in the memory device 150 or the data input/output operations are performed in an interleaving manner, the data input/output operations may be performed on a plane-by-plane basis. Referring to FIG. 4, four data input/output operations may be performed in parallel on four planes.

Each of data DATA1 and DATA2 stored in the memory device 150 may include a plurality of data segments SEG #1, SEG #2, SEG #3, and SEG #4. Sizes of the data DATA1 and DATA2 may be determined according to a configuration of the memory device 150. For example, it is assumed that a size of user data stored in a page included in the memory block 60 is 64 bits and a codeword including 8-bit error correction data in addition to the user data is 72(=64+8) bits. Each of the plurality of data segments SEG #1, SEG #2, SEG #3, and SEG #4 included in each of the data DATA1 and DATA2 may consist of a single codeword. Accordingly, each of the plurality of data segments SEG #1, SEG #2, SEG #3, and SEG #4 may have a length of 72 bits. Each of the data DATA1 and DATA2 may include 256 (=64×4) bits of user data.

As described in FIG. 1, the data segments SEG #1, SEG #2, SEG #3, and SEG #4, each having 72 bits, may be automatically corrected when a single-bit error is found in each data segment. When each data segment includes a 2-bit error, it may be guaranteed to detect the 2-bit error.

For example, it is assumed that an error has occurred in the first data segment SEG #1 of the first data DATA1 stored in the first plane Plane #1 of the first die Die #1. The controller 130 may perform hard decision decoding on the first data segment SEG #1. When the error occurring in the first data segment SEG #1 is a single-bit error, the hard decision decoding may succeed to correct the error included in the first data segment SEG #1. However, when the error occurring in the first data segment SEG #1 is a 2-bit error, the hard decision decoding to correct the error included in the first data segment SEG #1 may fail. In this case, the controller 130 performs the chipkill decoding using the other data segments SEG #2, SEG #3, and SEG #4 to correct the 2-bit error included in the first data segment SEG #1 because the other data segments SEG #2, SEG #3, and SEG #4, are associated with the first data segment SEG #1.

Referring to FIG. 4, the data segments SEG #1, SEG #2, SEG #3, and SEG #4 of each of the first data DATA1 and the second data DATA2 may be stored in four different planes Plane #1, Plane #2, Plane #3, and Plane #4, respectively.

Figure 5:
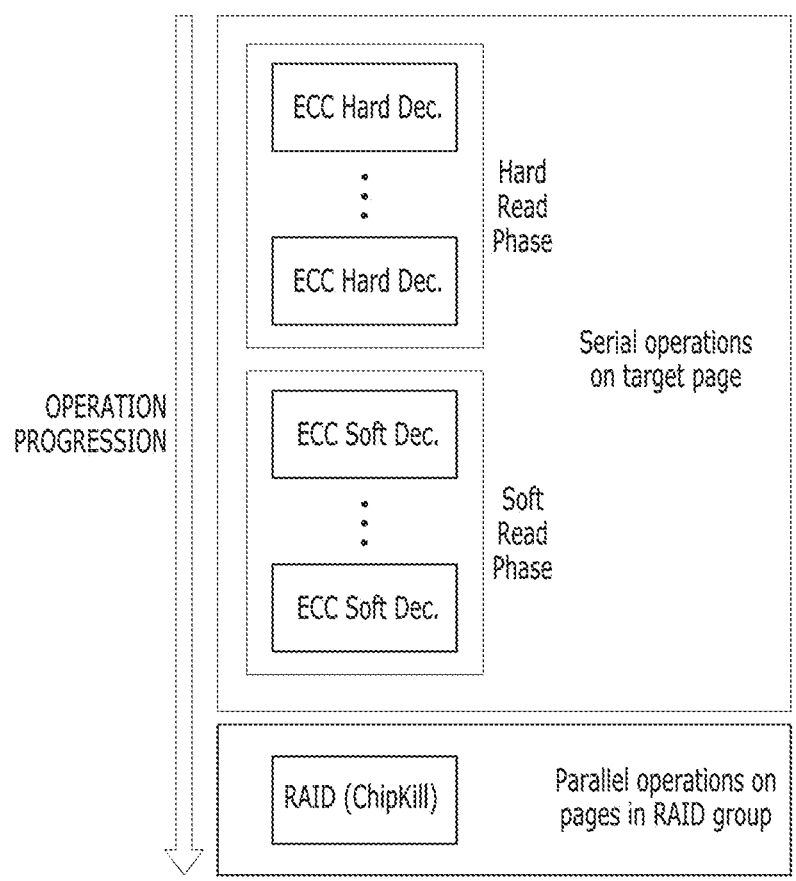
FIG. 5 illustrates an error correction operation performed in a memory system according to an embodiment of the present disclosure.

FIG. 5 illustrates an error correction operation performed in a memory system according to an embodiment of the present disclosure. Specifically, FIG. 5 shows the error correction operation that is performed by the controller 130 shown in FIGS. 1 to 3 when an error is included in data output from a specific location (e.g., a target page) of the memory device 150 shown in FIGS. 1 to 3.

Referring to FIG. 5, when the controller 130 detects an error in data output from the target page, a procedure for error correction may be performed on the data sequentially or serially. The procedure for error correction operation may include a step for performing hard decision decoding and another step for performing soft decision decoding. In the step for the hard decision decoding, a sensing (or reading) operation is performed to collect hard information used for the hard decision decoding. In the step for the soft decision decoding, a sensing (or reading) operation for collecting soft information may be performed. In the step for performing the hard decision decoding, the hard decision decoding may be performed multiple times. Likewise, the soft decision decoding may be performed multiple times in the step for performing the soft decision decoding.

When the hard decision decoding fails multiple times in the step for performing the hard decision decoding, the controller 130 may enter the step for performing the soft decision decoding. When the soft decision decoding fails multiple times in the step for performing the soft decision decoding, the controller 130 may perform the chipkill decoding. The chipkill decoding may include a process for correcting an error in data output from a specific plane based on data stored in another plane. The chipkill decoding may correspond to a system to which redundant arrays of independent disks (RAID) are applied.

When the data output from the target page includes a multi-bit error, the controller 130, which sequentially performs the hard decision decoding, the soft decision decoding and the chipkill decoding, may consume large resources to correct the multi-bit error. Because generation of soft information may require a longer sensing/reading time, i.e., a longer read latency, than generation of hard information, data input/output performance may be deteriorated when the soft decision decoding is performed multiple times after the hard decision decoding is performed multiple times.

Figure 6:
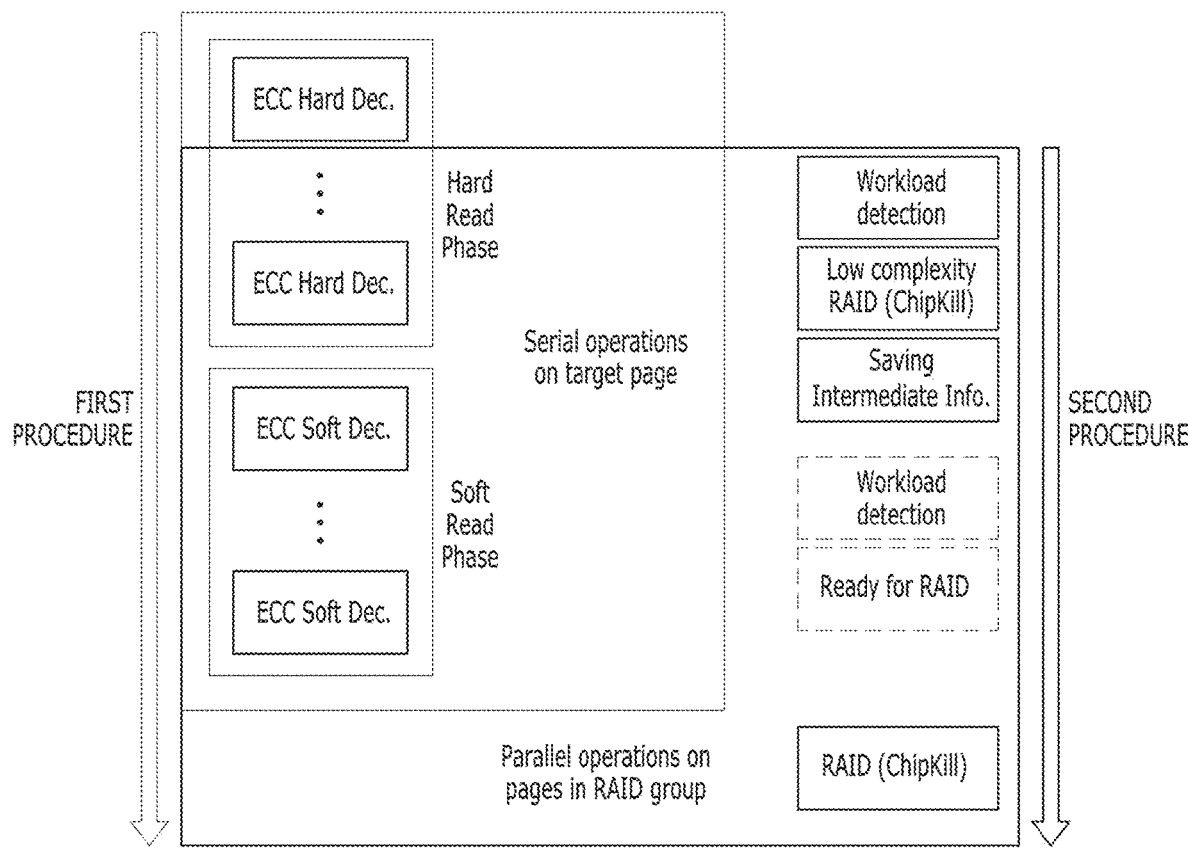
FIG. 6 illustrates an error correction operation performed in a memory system according to another embodiment of the present disclosure.

FIG. 6 illustrates an error correction operation performed in a memory system according to another embodiment of the disclosure. Specifically, FIG. 6 shows the error correction operation which is performed by the controller 130 shown in FIGS. 1 to 3 when an error is included in a data segment output from a specific location (e.g., a target page) of the memory device 150 shown in FIGS. 1 to 3.

Referring to FIG. 6, when the controller 130 detects that an error is included in a data segment output from the target page, a procedure for error correction may include plural procedures performed in parallel on the data segment. The procedure for error correction may include a first procedure for performing the hard decision decoding, the soft decision decoding, and the chipkill decoding in stages, and a second procedure for performing the chipkill decoding without performing the soft decision decoding.

In the first procedure, when performing the hard decision decoding for error correction, a sensing (or reading) operation may be performed on the data segment output from the target page to collect hard information used for the hard decision decoding. When performing the soft decision decoding, a sensing (or reading) operation may be performed to collect soft information. In the first procedure, the hard decision decoding may be performed multiple times. Likewise, the soft decision decoding may be performed multiple times.

According to an embodiment, if the hard decision decoding performed at least one time on the data segment output from the target page fails in the first procedure, the controller 130 may start the second procedure for performing the chipkill decoding. According to an embodiment, the controller 130 may perform the first and second procedures in parallel.

In the second procedure, a workload of the controller 130 may be monitored. Referring to FIGS. 1 and 4, the workload detector 194 may check whether another data segment can be sensed or read. Herein, the other data segment may be a data segment associated with the data segment output from the target page, e.g., a data segment transmitted through another channel, a data segment stored in a page included in another die or another plane, etc.

According to an embodiment, the chipkill decoding included in the second procedure may include a plurality of processes for error correction. For example, the chipkill decoding may be performed step by step depending on a complexity or a computational level. If the controller 130 can read another data segment from another die or another plane, which is associated with the data segment output from the target page, the controller 130 may first perform an operation of low complexity, i.e., a low complexity chipkill decoding, to achieve the chipkill decoding for correcting the error included in the data segment output from the target page. After performing the low complexity chipkill decoding, the controller 130 may store results of the low complexity chipkill decoding in the memory 144 (see FIGS. 1 to 3). Accordingly, the controller 130 may perform the chipkill decoding in parallel with the hard decision decoding and the soft decision decoding.

According to an embodiment, the controller 130 first performs the hard decision decoding and the soft decision decoding on the target page. After that, when the first procedure for error correction fails, the controller 130 performs the chipkill decoding. At this time, the controller 130 may utilize stored results of the low complexity chipkill decoding. Because the low complexity chipkill decoding is performed in advance while the first procedure for error correction is performed, the controller 130 can reduce resources (e.g., time or margin) required for performing the remaining operations of the chipkill decoding to be performed after the first procedure for error correction.

According to an embodiment, the controller 130 may detect or monitor a workload to determine whether it can perform the chipkill decoding while the first procedure for error correction is performed.

In addition, according to an embodiment, when it is determined that the controller 130 can perform the chipkill decoding, the controller 130 may perform the chipkill decoding in parallel before performing the soft decision decoding, for example, while the hard decision decoding is performed after the hard decision decoding has failed at least one time, or perform the chipkill decoding in parallel while the soft decision decoding is performed. When the error included in the data segment can be corrected more quickly through the chipkill decoding performed in parallel, the controller 130 can reduce the input/output performance degradation of the memory system 110, which is caused by performing the soft decision decoding multiple times.

While the second procedure for error correction including the low complexity chipkill decoding is performed in parallel with the first procedure, the controller 130 may store intermediate information obtained from the low complexity chipkill decoding in the memory 144. Even when performing the low complexity chipkill decoding using other data segments associated with the data segment output from the target page, the hard decision decoding on the other data segments may fail if errors included in some of the other data segments cannot be restored through the low complexity chipkill decoding. In this case, when intermediate information only for the segments recovered through the low complexity chipkill decoding is stored in the memory 144, the controller 130 can recognize in advance the segments whose errors have not been corrected by the low complexity chipkill decoding. In another embodiment, the controller 130 may not store the intermediate information obtained from the low complexity chipkill decoding in the memory 144.

As described above, while the hard decision decoding is performed multiple times and/or the soft decision decoding is performed multiple times, the controller 130 may perform at least some of the operations for the chipkill decoding. For example, the controller 130 may read another data segment from another location associated with the data segment read from the target page, and check whether the other data segment includes an error. In addition, when an error is included in the other data segment output, the controller 130 may perform the hard decision decoding on the other data segment to correct the error. When these processes or operations for the chipkill decoding may be performed in advance by the controller 130, the controller 130 may reduce resources for completing or achieving the chipkill decoding performed based on plural data segments after the soft decision decoding performed on the data segment read from the target page fails multiple times.

Figure 7:
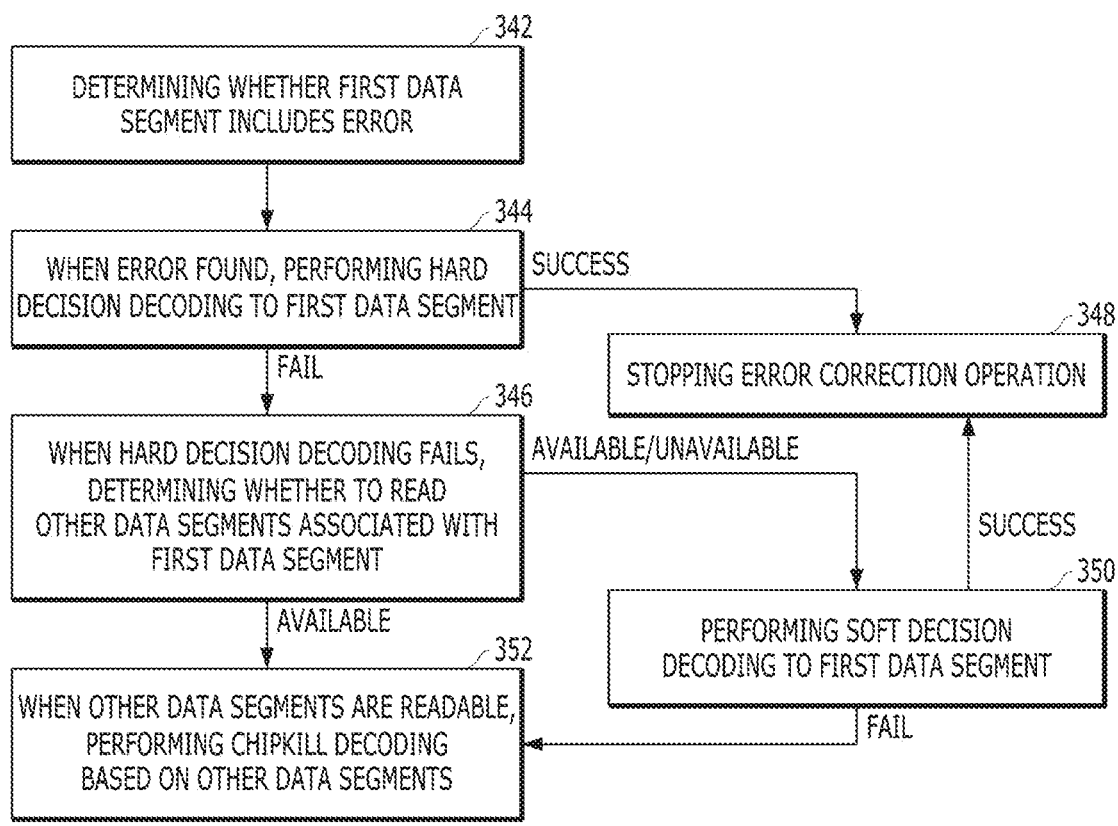
FIG. 7 illustrates a method of operating a memory system according to an embodiment of the present disclosure.

FIG. 7 illustrates a method for operating a memory system according to an embodiment of the disclosure. The method for operating the memory system shown in FIG. 7 is for checking whether there is an error in a data segment output from the memory device 150 (refer to FIGS. 1 to 3) and correcting the error. The method for operating the memory system may be performed by the controller 130 (refer to FIGS. 1 to 4).

Referring to FIG. 7, when an error is included in a subject data segment output from the memory device 150, the memory system 110 capable of correcting the error may perform plural procedures in parallel in response to an operation environment. Specifically, the method of operating the memory system 110 may include determining whether there is an error in a first data segment output from the memory device 150 (step 342). Here, the first data segment may be data corresponding to a request input from an external device, e.g., the host 102 shown in FIGS. 2 and 3. The controller 130 may sense or read a location (e.g., a specific page) in which the first data segment is stored, and store the first data segment in the memory 144. The controller 130 may check whether there is an error in the first data segment. Although not shown, when there is no error in the first data segment, the controller 130 may transmit the first data segment to the external device.

Although not shown, referring to FIG. 4, the first data segment, e.g., SEG #1, may be associated with other data segments, e.g., SEG #2, SEG #3, and SEG #4, programmed at different locations of the memory device 150, e.g., at different planes. Here, association between the first data segment and the other data segments is caused by a program operation of the memory system 110, and the external device (e.g., the host 102) may not recognize the association. That is, the host 102 may transmit plural data segments and a plurality of logical addresses, each of which corresponds to each of the plural data segments, to the memory system 110. For example, the association between the first data segment and the other data segments may not be related even to interrelationship between the plurality of logical addresses.

When the controller 130 programs the plural data segments to the memory device 150, program operations with the plural data segments are performed in parallel on a plurality of regions (e.g., the planes described in FIG. 4) in the memory device 150. Through the program operation performed in parallel for the plural data segments, it is possible for the memory system 110 to improve performance of data input/output operation. For example, the controller 130 may use an ECC encoder to add an error correction bit to each of plural data segments of user data input from the external device to generate a plurality of codewords, each codeword including an error correction bit and a data segment. After generating the plurality of codewords, the controller 130 may store each of the plurality of codewords in different locations, e.g., different planes in the memory device 150 (see FIG. 4). The association between the plurality of codewords, i.e., the first data segment and the other data segments, may occur in these processes. That is, the first data segment and the other data segments may correspond to the plural data segments of the user data and be stored in different locations, e.g., different planes in the memory device 150 as shown in FIG. 4.

The method for operating the memory system 110 may include performing the hard decision decoding to correct an error when the error is found in the first data segment after the first data segment is read (step 344). According to an embodiment, referring to FIGS. 5 to 6, the controller 130 may perform the hard decision decoding multiple times on the first data segment in which the error is found. If the hard decision decoding for the first data segment is successful, the memory system 110 may stop the error correction operation (step 348). Although not illustrated, when the error is recovered through the hard decision decoding, the memory system 110 may output the first data segment which the error is corrected to the external device.

The method for operating the memory system 110 may include determining whether another data segment associated with the first data segment can be read when the hard decision decoding fails (step 346). When the hard decision decoding fails at least one time, the controller 130 may detect a workload of the memory system 110. For example, the controller 130 may check an operation state of each die or each plane in the memory device 150. The controller 130 can monitor a data input/output operation performed through each die or each plane, and determines whether each die or each plane can output a data segment used for error correction (e.g., the chipkill decoding) on the first data segment rather than a data input/output operation corresponding to a request input from the external device.

Regardless of whether other data segments associated with the first data segment can be read, the method for operating the memory system 110 may include performing the soft decision decoding on the first data segment when the hard decision decoding fails (step 350). Here, the soft decision decoding may be performed after the hard decision decoding performed on the first data segment fails multiple times.

Referring to FIGS. 5 to 6, the controller 130 may perform the soft decision decoding multiple times on the first data segment in which an error is found. When the soft decision decoding performed on the first data segment succeeds, the memory system 110 may stop the error correction (step 348). According to an embodiment, if the soft decision decoding on the first data segment fails, the memory system may perform the chipkill decoding based on a plurality of data segments including the first data segment and the other data segments associated with the first data segment.

Meanwhile, when the other data segments associated with the first data segment can be read, the method for operating the memory system 110 may include performing the chipkill decoding based on the plurality of data segments (step 352). The controller 130 may perform all or some operations for the chipkill decoding in parallel with another error correction procedure such as the hard decision decoding and the soft decision decoding. For example, the controller 130 may perform some operations for the chipkill decoding in parallel with the hard decision decoding or the soft decision decoding, and may hold the remaining operations for the chipkill decoding until the soft decision decoding on the first data segment fails. In another example, when the controller 130 performs the entire operation for the chipkill decoding, the soft decision decoding on the first data segment may be performed in parallel with the chipkill decoding, or the soft decision decoding may be skipped.

According to an embodiment, some operations for the chipkill decoding may be performed after the hard decision decoding fails at least one time while the hard decision decoding is performed multiple times on the first data segment and when the other data segments associated with the first data segment are readable. For example, some operations for the chipkill decoding may be performed in parallel while the hard decision decoding and/or the soft decision decoding are performed multiple time on the first data segment.

Figure 8:
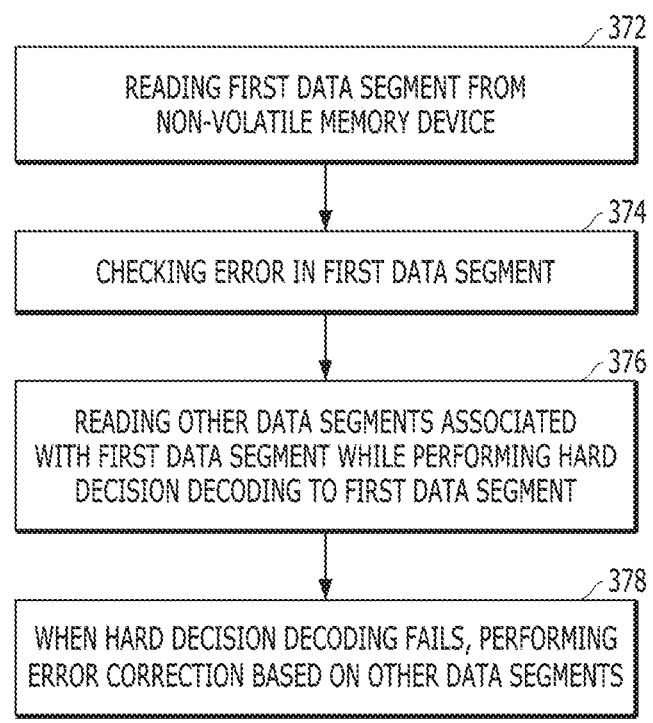
FIG. 8 illustrates a method of operating a memory system according to another embodiment of the present disclosure.

FIG. 8 illustrates a method for operating a memory system according to another embodiment of the disclosure. According to an embodiment, the method for operating the memory system is to check whether there is an error in a data segment output from the memory device 150 (refer to FIGS. 1 to 3) and correct the error when the error is included in the data segment. The method for operating the memory system may be executed by the controller 130 (refer to FIGS. 1 to 4).

Referring to FIG. 8, the method for operating the memory system includes reading a first data segment stored in a non-volatile memory device (step 372), checking an error included in the first data segment (step 374), reading other data segments associated with the first data segment while performing the hard decision decoding on the first data segment (step 376), and using the other data segments for correcting the error included in the first data segment when the hard decision decoding fails (step 378).

Although not shown, when there is no error in the first data segment, a procedure for error correction may not be performed. In addition, it can be understood that the association between the first data segment and the other data segments is established through an operation for programming a plurality of data segments in the memory device 150.

Although not shown, according to an embodiment, when an error occurs in the first data segment, the hard decision decoding and the soft decision decoding may be sequentially performed on the first data segment. Further, when the error included in the first data segment is not corrected through the hard decision decoding, the controller 130 senses or reads other data segments associated with the first data segment to correct the error included in the first data segment through the chipkill decoding. Through these processes, the controller 130 may perform error correction operations in parallel.

According to an embodiment, when the hard decision decoding for correcting the error in the first data segment fails, the soft decision decoding may be performed on the first data segment. In this case, even if the controller 130 senses or reads the other data segments associated with the first data segment, the controller 130 may stand by without directly utilizing the other data segments to correct the error in the first data segment. The controller 130 may check whether an error is also included in the other data segments. When the error is included in the other data segments, the error may be corrected through the hard decision decoding. According to an embodiment, when an error is found in the other data segments, the maximum number of performing the hard decision decoding on the other data segments is less than the number of performing the hard decision decoding on the first data segment. This is because the controller 130 tries to concentrate and use resources to correct the error included in the first data segment rather than correcting the error included in the other data segments.

Although not shown, the controller 130 may sequentially or in parallel perform the hard decision decoding, the soft decision decoding, and the chipkill decoding to correct the error included in the first data segment. When the error included in the first data segment is corrected through one of the hard decision decoding, the soft decision decoding, and the chipkill decoding, the error correction operation for the first data segment may be terminated.

The memory system according to an embodiment of the present disclosure can increase efficiency of error recovery.

In addition, the memory system according to another embodiment of the present disclosure can reduce resource consumption for error recovery.

Further, the memory system according to another embodiment of the present disclosure can improve performance of data input/output operations by reducing a delay caused by an error recovery operation.

While the present teachings have been illustrated and described with respect to the specific embodiments, it will be apparent to those skilled in the art in light of the present disclosure that various changes and modifications may be made without departing from the spirit and scope of the disclosure as defined in the following claims.

What is claimed is:

1. A memory system, comprising:
a memory device including a plurality of non-volatile memory groups individually storing a plurality of data segments, each data segment corresponding to a codeword; and
a controller configured to perform hard decision decoding to correct an error when the error is included in a first data segment among the plurality of data segments, determine whether other data segments associated with the first data segment, among the plurality of data segments, are readable when the hard decision decoding fails, and perform chipkill decoding based on the first data segment and the other data segments when the other data segments are readable.

2. The memory system according to claim 1, wherein the controller is configured to perform the chipkill decoding, and additional hard decision decoding or soft decision decoding on the first data segments in parallel when the other data segments are readable.

3. The memory system according to claim 1, wherein the controller is further configured to skip performing soft decision decoding on the first data segment before performing the chipkill decoding when the other data segments are readable.

4. The memory system according to claim 1, wherein the controller is configured to perform hard decision decoding on the other data segments when the other data segments include an error,
wherein a maximum number of hard decision decoding performed on the other data segments is less than a number of hard decision decoding performed on the first data segment.

5. The memory system according to claim 1, wherein the controller is configured to perform the hard decision decoding a preset number of times,
wherein the hard decision decoding finally fails when the error is not corrected after the hard decision decoding is performed the preset number of times.

6. The memory system according to claim 5, wherein the controller is configured to determine whether the other data segments are readable when a second hard decision decoding to the first data segment starts after a first hard decision decoding to the first data segment fails.

7. The memory system according to claim 6, wherein the controller is configured to perform read operations for reading the other data segments in an interleaving manner, wherein the read operations and the hard decision decoding to the first data segment are performed in parallel.

8. The memory system according to claim 1, wherein the controller is configured to stop the chipkill decoding when the hard decision decoding succeeds.

9. The memory system according to claim 1, wherein the controller is configured to store a result of the hard decision decoding, and adjust a read voltage based on the result of the hard decision decoding while correcting an error included in the other data segments.

10. A method for operating a memory system, comprising a memory device including a plurality of non-volatile memory groups individually storing a plurality of data segments, each data segment corresponding to a codeword, and a controller configured to control the memory device, the method comprising:
determining whether a first data segment among the plurality of data segments includes an error;
performing hard decision decoding to correct the error when the error is included in the first data segment;
determining whether other data segments associated with the first data segment, among the plurality of data segments, are readable when the hard decision decoding fails; and
performing chipkill decoding based on the first data segment and the other data segments when the other data segments are readable.

11. The method according to claim 10, further comprising:
performing the chipkill decoding, and additional hard decision decoding or soft decision decoding to the first data segment in parallel when the other data segments are readable.

12. The method according to claim 10, further comprising:
skipping soft decision decoding to the first data segment before performing the chipkill decoding when the other data segments are readable.

13. The method according to claim 10, further comprising:
performing hard decision decoding to the other data segments when the other data segments include an error,
wherein a maximum number of hard decision decoding performed to the other data segments is less than a number of hard decision decoding performed to the first data segment.

14. The method according to claim 10, further comprising:
performing the hard decision decoding a preset number of times,
wherein the hard decision decoding finally fails when the error is not corrected after the hard decision decoding is performed to the first data segment the preset number of times.

15. The method according to claim 14, wherein the determining whether the other data segments are readable includes:
determining whether the other data segments are readable when a second hard decision decoding to the first data segment starts after a first hard decision decoding to the first data segment fails.

16. The method according to claim 15, further comprising:
performing read operations for reading the other data segments in an interleaving manner,
wherein the read operations and the hard decision decoding to the first data segment are performed in parallel.

17. The method according to claim 10, further comprising:
stopping the chipkill decoding when the hard decision decoding succeeds.

18. The method according to claim 17, further comprising:
storing a result of the hard decision decoding; and
adjusting a read voltage based on the result of the hard decision decoding while recovering an error included in the other data segments.

19. A computer program product tangibly stored on a non-transitory computer readable medium, the computer program product comprises instructions to cause a multicore processor device that comprises a plurality of processor cores with multiple ones of the plurality of processor cores each comprising a processor and circuitry configured to couple the processor to a memory device including a plurality of non-volatile memory groups individually storing a plurality of data segments to:

read a first data segment among the plurality of data segments;
determine whether the first data segment includes an error;
perform hard decision decoding to correct the error when the error is included in the first data segment;
determine whether other data segments associated with the first data segment, among the plurality of data segments, are readable when the hard decision decoding fails; and
perform chipkill decoding based on the first data segment and the other data segments when the other data segments are readable.

20. The computer program product according to claim 19, wherein the chipkill decoding, and additional hard decision decoding or soft decision decoding are performed to the first data segment in parallel when the other data segments are readable.

* * * * *